(12) United States Patent
Lee et al.

(10) Patent No.: US 7,638,345 B2
(45) Date of Patent: Dec. 29, 2009

(54) METHOD OF MANUFACTURING SILICON NANOWIRES AND DEVICE COMPRISING SILICON NANOWIRES FORMED BY THE SAME

(75) Inventors: Eun Kyung Lee, Suwon-si (KR); Byoung Lyong Choi, Seoul (KR); Soon Jae Kwon, Seongnam-si (KR); Kyung Sang Cho, Gwacheon-si (KR); Jae Ho Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 259 days.

(21) Appl. No.: 11/444,115

(22) Filed: May 31, 2006

(65) Prior Publication Data
US 2007/0232028 A1     Oct. 4, 2007

(30) Foreign Application Priority Data
Mar. 29, 2006     (KR) .................. 10-2006-0028474

(51) Int. Cl.
*B82B 3/00*     (2006.01)
(52) U.S. Cl. .................. 438/27; 977/762; 977/778; 977/780; 977/784; 977/785; 977/932; 977/949; 257/E51.026; 257/E33.054
(58) Field of Classification Search ......... 438/775–777, 438/22, 28, 34; 257/E39, E51.038–E51.04, 257/E23.074, E23.165, 79, 88, E51.026; 252/62.3 E; 313/502–504; 977/762–763, 977/778–780, 784–785, 855, 882, 932, 936, 977/938–939, 949
See application file for complete search history.

(56) References Cited

U.S. PATENT DOCUMENTS

| | | | | |
|---|---|---|---|---|
| 6,129,901 | A * | 10/2000 | Moskovits et al. | 423/447.3 |
| 6,610,463 | B1 * | 8/2003 | Ohkura et al. | 430/322 |
| 6,803,260 | B2 * | 10/2004 | Shin et al. | 438/142 |
| 6,838,297 | B2 * | 1/2005 | Iwasaki et al. | 438/20 |
| 6,841,082 | B2 * | 1/2005 | Ha et al. | 216/44 |
| 7,079,250 | B2 * | 7/2006 | Mukai | 356/445 |
| 7,183,127 | B2 * | 2/2007 | Kuriyama et al. | 438/34 |

(Continued)

FOREIGN PATENT DOCUMENTS

KR     102005056328     6/2005

(Continued)

OTHER PUBLICATIONS

T. Kimura, K. Ueda, R. Saito, K. Masakai, H. Isshiki, Ebrium-silicon-oxide nano-crystallite waveguide formation based on nano-porous silicon, Japan, Elsevier, 2004.*

(Continued)

*Primary Examiner*—Matthew C Landau
*Assistant Examiner*—Maliheh Malek
(74) *Attorney, Agent, or Firm*—Cantor Colburn LLP

(57) ABSTRACT

A method of manufacturing silicon nanowires is characterized in that silicon nanowires are formed and grown through a solid-liquid-solid process or a vapor-liquid-solid process using a porous glass template having nanopores doped with erbium or an erbium precursor. In addition, a device including silicon nanowires formed using the above exemplary method according to the present invention can be effectively applied to various devices, for example, electronic devices such as field effect transistors, sensors, photodetectors, light emitting diodes, laser diodes, etc.

22 Claims, 3 Drawing Sheets

U.S. PATENT DOCUMENTS

| | | | |
|---|---|---|---|
| 7,335,408 B2* | 2/2008 | Kyotani et al. | 428/34.1 |
| 7,402,531 B1* | 7/2008 | Kuekes et al. | 438/755 |
| 7,435,996 B2* | 10/2008 | Jin et al. | 257/88 |
| 7,465,954 B2* | 12/2008 | Kamins et al. | 257/13 |
| 2002/0102081 A1* | 8/2002 | Voevodkin | 385/123 |
| 2002/0131742 A1* | 9/2002 | Bayart et al. | 385/125 |
| 2003/0123827 A1* | 7/2003 | Salerno et al. | 385/129 |
| 2004/0011670 A1* | 1/2004 | Broadley et al. | 205/775 |
| 2004/0028875 A1* | 2/2004 | Van Rijn et al. | 428/98 |
| 2004/0157354 A1* | 8/2004 | Kuriyama et al. | 438/45 |
| 2004/0164327 A1* | 8/2004 | Shin et al. | 257/208 |
| 2004/0187524 A1* | 9/2004 | Sen et al. | 65/390 |
| 2005/0253138 A1* | 11/2005 | Choi et al. | 257/40 |
| 2005/0269576 A1* | 12/2005 | Park et al. | 257/79 |
| 2006/0091408 A1* | 5/2006 | Kim et al. | 257/94 |
| 2006/0128155 A1* | 6/2006 | Miyata et al. | 438/694 |
| 2006/0182966 A1* | 8/2006 | Lee et al. | 428/375 |
| 2006/0266402 A1* | 11/2006 | Zhang et al. | 136/205 |
| 2007/0048477 A1* | 3/2007 | Oh | 428/36.92 |
| 2007/0128808 A1* | 6/2007 | Choi et al. | 438/270 |
| 2007/0172183 A1* | 7/2007 | Wang | 385/125 |
| 2007/0257246 A1* | 11/2007 | Bakkers et al. | 257/2 |
| 2008/0038918 A1* | 2/2008 | Fukutani et al. | 438/635 |
| 2008/0116465 A1* | 5/2008 | Moon et al. | 257/79 |
| 2008/0211520 A1* | 9/2008 | Kamins | 324/691 |
| 2009/0035908 A1* | 2/2009 | Pribat et al. | 438/270 |
| 2009/0045720 A1* | 2/2009 | Lee et al. | 313/503 |
| 2009/0108251 A1* | 4/2009 | Kabir | 257/14 |
| 2009/0130380 A1* | 5/2009 | Asakawa et al. | 428/116 |
| 2009/0166903 A1* | 7/2009 | Kim et al. | 264/1.1 |
| 2009/0202605 A1* | 8/2009 | Sakamoto et al. | 424/423 |

FOREIGN PATENT DOCUMENTS

| | | |
|---|---|---|
| KR | 1020050103023 | 10/2005 |

OTHER PUBLICATIONS

J. Wu, L. Dong, J. Petty, C. Pan, J. Jiao, Fabrication of metal-gated carbon nanotube emitter arrays assisted by focused ion beam and chemical vapor deposition, Microsc Microanal, 2005.*

* cited by examiner

METHOD OF MANUFACTURING SILICON NANOWIRES AND DEVICE COMPRISING SILICON NANOWIRES FORMED BY THE SAME

This application claims priority to Korean Patent Application No. 2006-28474, filed on Mar. 29, 2006, and all the benefits accruing therefrom under 35 U.S.C. § 119(a), the contents of which in its entirety are herein incorporated by reference.

BACKGROUND OF THE INVENTION

1. Field of the Invention

The present invention relates, generally, to a method of manufacturing silicon nanowires using a porous glass template and a device including silicon nanowires formed using the same. More particularly, the present invention relates to a method of manufacturing silicon nanowires formed and grown through a solid-liquid-solid ("SLS") process or a vapor-liquid-solid ("VLS") process using a porous glass template having nanopores doped with erbium or an erbium precursor, and a device with increased structural efficiency having silicon nanowires formed using the above method.

2. Description of the Related Art

In general, nanowires are linear material having a diameter on the nanometer scale (e.g., $1 \text{ nm} = 10^{-9}$ m) and a length much larger than the diameter, for example, on the hundreds of nanometer, micrometer ($1 \text{ μm} = 10^{-6}$ m), or millimeter ($1 \text{ mm} = 10^{-3}$ m) scale. The properties of such nanowires depend on the diameter and length thereof.

Nanowires may be variously applied to minute devices due to their small size, and are advantageous because they exhibit optical properties of polarization or electron shift in a predetermined direction.

Presently, research into methods of preparing nanoparticles and into properties of the nanoparticles is being actively conducted. However, general methods of manufacturing nanowires are not yet well developed. Such methods for manufacturing nanowires typically include chemical vapor deposition ("CVD"), laser ablation and a template process.

According to the template process pores having a diameter ranging from one nanometer to hundreds of nanometers are formed, and such a pore is used as a nanowire template. The template process includes oxidizing an aluminum electrode to form aluminum oxide on the surface thereof, electrochemically etching the aluminum oxide to form nanopores, dipping the electrode into a solution containing metal ions, applying voltage to stack the metal ions on the aluminum electrode through pores so that the pores are filled with the metal ions, and then removing the oxide using an appropriate process, thus obtaining only the metal ions which filled the pores. Those stacked metal ions are metal nanowires.

However, such a conventional method of manufacturing nanowires is disadvantageous because the process is considerably complicated and requires a long period of time, and is thus unsuitable for mass production. Further, such methods make it impossible to form nanowires having excellent linearity and arrangement.

Silicon, having an indirect band gap, is generally difficult to use as optical material. However, an electrooptic technique using silicon at room temperature may be realized through a combination of a nano-device, capable of having a quantum effect, and a doping technique using luminescent material. To this end, the development of a doping technique enabling efficient luminescence and a manufacturing technique able to decrease the size of the device to the nanoscale is required.

Since erbium (Er) has an emission peak at 1.54 μm, resulting in a minimum loss in the wavelength ranges used for optical communication, it is receiving attention as a material for use in silicon-based electrooptic devices. Moreover, the potential luminous properties of such a device may be greatly improved by the energy from the excitons of silicon nanowires or silicon nanocrystals.

With regard to the method of manufacturing a photonic device using erbium, a method of manufacturing a silicon-based photonic device by doping silicon nanowires formed on a silicon substrate with erbium has been disclosed in Korean Patent Laid-open Publication No. 2005-103023. However, the above patent publication suffers because this method can be applied only to photoluminescent devices.

In addition, a method of manufacturing a nano-dot array is disclosed in Korean Patent Laid-open Publication No. 2003-056328. The disclosed method includes forming an etching mask on a silicon film doped with erbium using a template having holes and then etching the exposed film portion to remove it. However, this method is limited because it forms nanowires via an etching process, rather than a growing process.

BRIEF SUMMARY OF THE INVENTION

The present invention solves the above problems occurring in the related art, and an aspect of the present invention includes providing a method of manufacturing silicon nanowires by forming and growing silicon nanowires through a solid-liquid-solid ("SLS") process or a vapor-liquid-solid ("VLS") process using a porous glass template.

Another aspect of the present invention includes providing a device with increased structural efficiency including silicon nanowires which can be applied to a wide variety of devices including photoluminescent devices.

In accordance with an exemplary embodiment of the present invention a method of manufacturing silicon nanowires includes: doping a porous glass template having a plurality of wire-shaped pores with erbium or an erbium precursor; disposing the porous glass template doped with the erbium or erbium precursor on a metal catalyst layer formed on a substrate; and forming and growing silicon nanowires along the pores in the glass template.

In accordance with another exemplary embodiment of the present invention a device includes: silicon nanowires grown along the pores of a porous glass template; and a porous glass template, wherein the porous glass template has been doped with erbium or an erbium precursor, then disposed on a metal catalyst layer formed on a template to grow and form the silicon nanowires.

In accordance with yet another exemplary embodiment of the present invention a device includes silicon nanowires formed along pores in a porous glass template.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Figure 1:
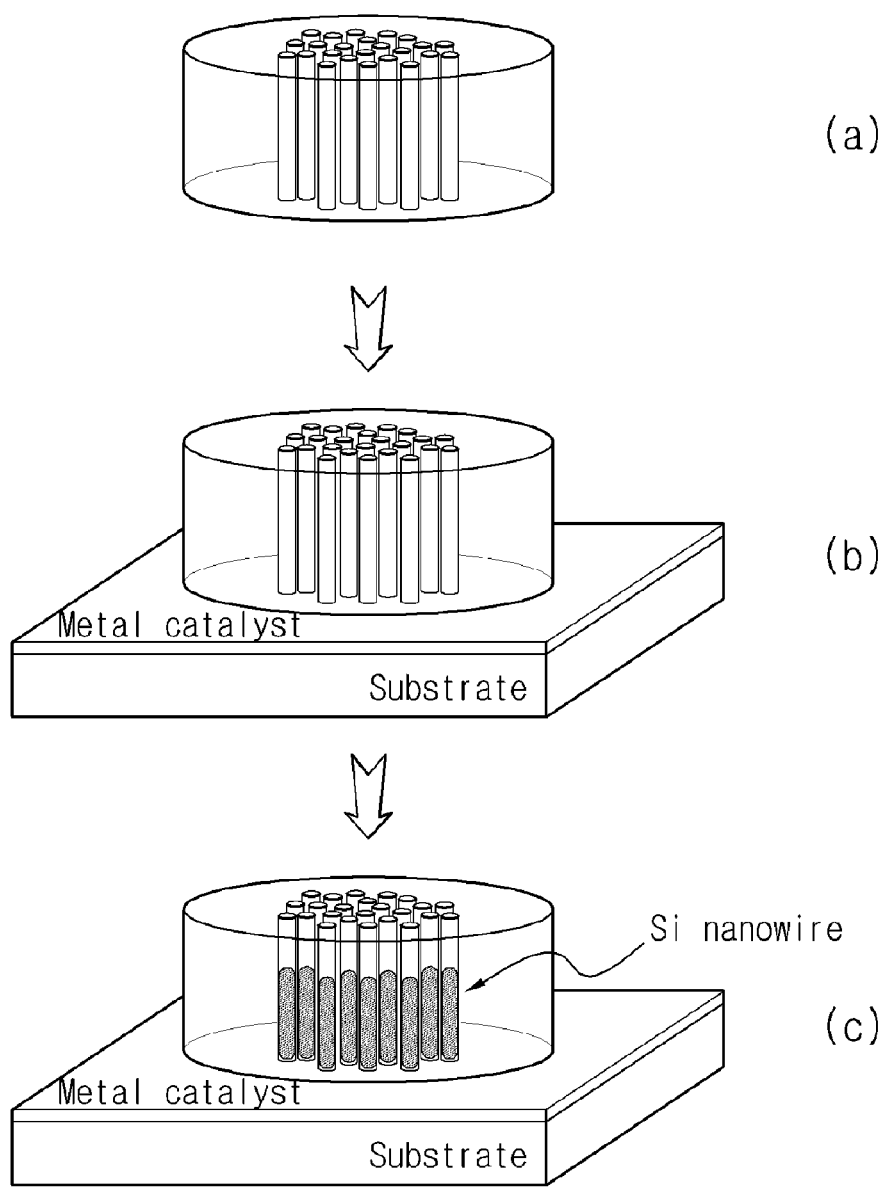
FIG. 1 is a perspective view showing an exemplary embodiment of a principle of manufacturing silicon nanowires using a porous glass template according to the present invention.

The present invention will now be described more fully hereinafter with reference to the accompanying drawings, in which exemplary embodiments of the present invention are shown. This invention may, however, be embodied in many different forms and should not be construed as limited to the exemplary embodiments set forth herein. Rather, these exemplary embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

According to the present invention, an exemplary method of manufacturing silicon nanowires may be characterized in that silicon nanowires may be formed and grown through an SLS process or a VLS process using a glass template having nanopores.

FIG. 1 is a perspective view showing an exemplary embodiment of a principle of manufacturing silicon nanowires using a porous glass template according to the present invention. As shown in FIG. 1, an exemplary embodiment of the method of the present invention comprises: doping a porous glass template 1 with erbium or an erbium precursor to exhibit conductivity as shown in block 100, disposing the glass template 1 doped with the erbium or erbium precursor on a substrate 2 on which a metal catalyst layer 3 is formed as shown in block 200, and forming and growing silicon nanowires 4 along the pores in the glass template using an SLS process or a VLS process as shown in block 300.

According to an exemplary embodiment of the present invention, when the silicon nanowires are formed through the SLS process or the VLS process using the porous glass template, the diameter and length of the silicon nanowires may be easily controlled. In an alternative exemplary embodiment, the silicon nanowires may be formed into a superlattice structure or a hybrid structure by changing the material or composition thereof. In a further exemplary embodiment, doped silicon nanowires may be formed via a doping process using a dopant at the time of growth of the silicon nanowires.

An exemplary embodiment of the manufacturing method of the present invention is described below.

Block 100 illustrates doping a porous glass template with erbium or erbium precursor to exhibit conductivity. In order to manufacture the silicon nanowires according to an exemplary embodiment of the present invention, a porous glass template including a plurality of long wire-shaped pores may be used.

Conventionally, as a template for the formation of nanowires, anodic aluminum oxide (AAO) has mainly been used. However, since the size and length of pores are controlled depending on the applied voltage the pores of the above template are difficult to form at a desired position. Further, in the case where the template is not completely etched in a longitudinal direction to form pores, the portion in which the pores are not formed must be removed, therefore complicating the process. Furthermore, since the melting point of aluminum present in the template is 660° C., the wires cannot be formed through the SLS process, which requires high temperatures. Moreover, AAO is opaque, and thus cannot be applied to the fabrication of photonic devices.

In contrast, according to an exemplary embodiment of the present invention the glass template may be made by bundling fibers having large pores and then elongating them at one time, which makes forming uniform pores at a desired position easier. Additionally, since the length of the template may be determined by the extent to which the fibers are cut, the template may be formed to various lengths defining uniform pores. In addition, the process is simple and the melting point of glass is 1700° C. Thus, the wires may be formed through the SLS process at high temperatures. Further, since the material may be transparent, it may be applied to photonic devices. An additional advantage of the exemplary embodiment is that optical fiber techniques, which have been conventionally studied, may be employed.

Since the diameter and height of the porous glass template characteristically used in an exemplary embodiment of the present invention can be freely controlled, those features may be selected depending on the size of the substrate on which the silicon nanowires are to be grown. In exemplary embodiments, the diameter of the template ranges from about 1 nm to about 1 mm and the height thereof ranges from about 100 nm to about 1 mm, but the present invention is not limited thereto. The variations in pores in the porous template correspond to the dimensions of the silicon nanowires to be manufactured. According to an exemplary embodiment, the pores are formed having a diameter ranging from about 1 nm to about 100 nm and at intervals ranging from about 2 nm to about 1 µm.

The process of doping the porous glass template with erbium or an erbium precursor is not particularly limited so long as it does not inhibit the purpose of the present invention. A typical process in the art may be applied. One exemplary embodiment is ion implantation, in which erbium may be implanted using about one to about nine MeV of energy and may then be heat treated to minimize loss in the glass. Other exemplary embodiments may apply; electrochemical deposition, spin-on doping, chemical deposition, sputtering, laser ablation, coprecipitation, a wet process, or a sol-gel process.

According to another exemplary embodiment, erbium chloride ($ErCl_3$) may be used as the erbium precursor.

Block 200 illustrates disposing the glass template doped with erbium or erbium precursor on a substrate on which a metal catalyst layer is formed. After the formation of the glass template doped with erbium, such a glass template may be disposed on a metal catalyst layer formed on a substrate. According to an exemplary embodiment of the present invention, the metal catalyst layer may be formed by coating a substrate with a metal catalyst, for example, a gold (Au) metal catalyst. As such, the substrate may be previously washed using a typical process to remove impurities.

An exemplary embodiment of the substrate in the present invention may be a silicon substrate or a glass substrate coated with silicon.

Any metal may be used as the metal catalyst to be applied on the substrate, so long as it enables growth of the wire. Exemplary embodiments of the metal include, but are not limited to, Au, Ni, Fe, Ag, Pd, and Pd/Ni, Pd/Au.

The metal catalyst may be applied on the substrate in the form of nanoparticles or a thin film. According to an exemplary embodiment of the present invention the resulting metal catalyst coating layer may be preferably applied on the substrate to a thickness of 50 nm or less.

The process of applying the metal catalyst on the substrate is not particularly limited so long as it does not inhibit the purpose of the present invention. Typical coating processes used in the art, for example, CVD, sputtering, e-beam evaporation, vacuum deposition, spin coating, or dipping, may be used.

Block 300 illustrates forming and growing silicon nanowires along the pores in the glass template using an SLS process or a VLS process. According to an exemplary embodiment of the present invention, the silicon nanowires are formed using the SLS process or the VLS process.

Figure 2:
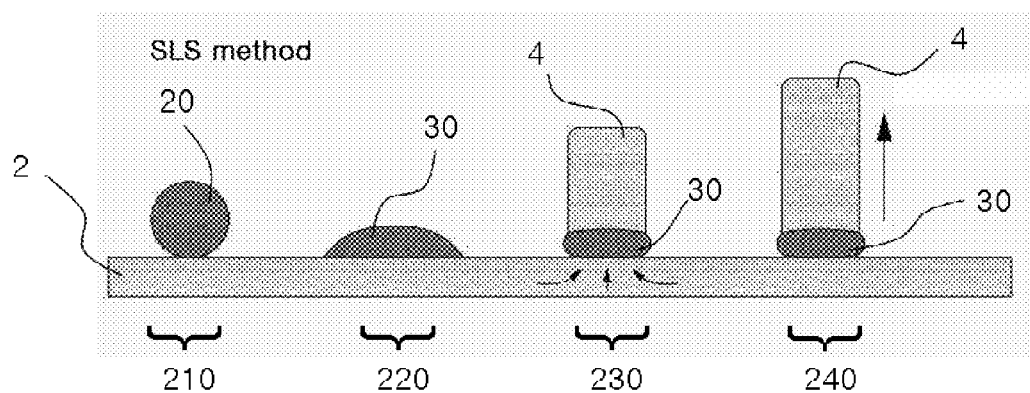
FIG. 2 is a schematic process flow diagram of an exemplary embodiment of a method of manufacturing silicon nanowires through an SLS process, the flow diagram illustrating cross-sectional views of the silicon nanowires according to the present invention.

The SLS process is illustrated in the process flow diagram showing cross-sectional views of an exemplary embodiment in FIG. 2. As shown in block 210, a metal catalyst 20 is disposed on a solid silicon substrate 2. In block 220, the metal catalyst is transformed by the heat of a furnace (not shown) and becomes a molten alloy liquid 30. Block 230 illustrates silicon being diffused from the solid silicon substrate 2 and condensing and crystallizing on the surface of the molten catalyst 30 to form a nanowire 4. The arrows in this block indicate the direction of diffusion from the substrate 2 to the molten metal catalyst 30. This process continues in block 240 until a nanowire 4 of desired length is formed. The arrow indicates the direction of the nanowire growth. This entire process may be conducted without the additional supply of vapor silicon.

Figure 3:
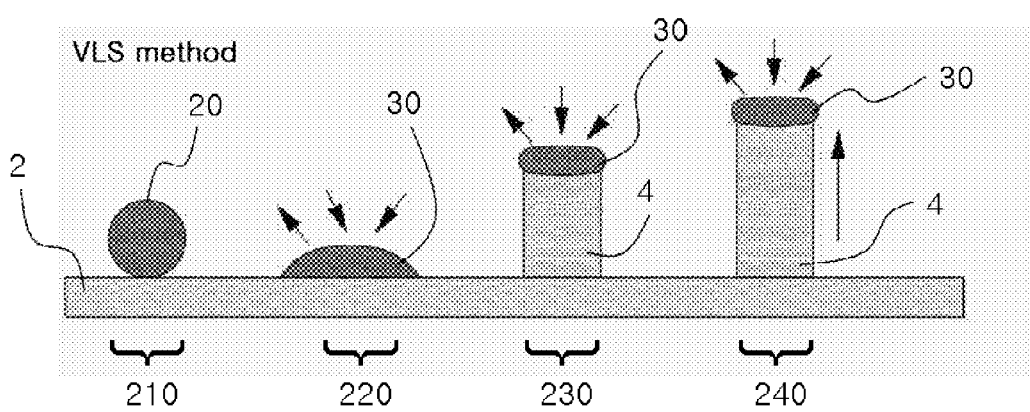
FIG. 3 is a process flow diagram of an exemplary embodiment of a method of manufacturing silicon nanowires through a VLS process, the flow diagram illustrating cross-sectional views of the silicon nanowires according to the present invention.

The VLS process is illustrated in the process flow diagram showing a cross sectional view of an exemplary embodiment in FIG. 3. Similar to the VLS process, at block 210, a metal catalyst 20 is disposed on a solid silicon substrate 2. In block 220, the metal catalyst is transformed by the heat of a furnace (not shown) and becomes a molten alloy liquid 30. A vapor species containing silicon is introduced into the furnace and begins to dissolving, as indicated by the arrows, into the molten alloy liquid 30. In block 230 the dissolved silicon in the molten alloy liquid 30 begins crystallizing at the interface between the molten alloy liquid and the underlying substrate to form a nanowire 4. This process continues in block 240 until a nanowire 4 of desired length is formed. The arrow indicates the direction of the nanowire growth. According to exemplary embodiments of the present invention catalysts such as gold (Au), cobalt (Co), nickel (Ni), etc., may be used.

According to an exemplary embodiment of the present invention, the SLS process may be conducted by placing a substrate on which a template is disposed in a furnace, and then heating the substrate while supplying a gas, so that silicon nanowires are formed by a wire source diffused from the substrate.

According to another exemplary embodiment of the present invention, the VLS process may be conducted by placing a substrate on which a template is disposed in a furnace, and then heating the substrate while supplying a gas and a wire source, thereby forming silicon nanowires.

More specifically, the gas used in the SLS process or VLS process may be selected from the group consisting of Ar, $N_2$, He and $H_2$, but is not limited thereto. Although the gas may be supplied in an amount of 100 sccm, the present invention is not limited thereto and such supply may vary depending on the process.

According to an exemplary embodiment the SLS process may be conducted at about 800° C. to about 1200° C. under about 760 torr or less, and the VLS process may be conducted at about 370° C. to about 600° C. under about 760 torr or less when using a gold catalyst. The heating time may be adjusted depending on the desired length of the silicon nanowires.

In the VLS process, exemplary embodiments of the supplied wire source are $SiH_4$, $SiCl_4$, or $SiH_2Cl_2$.

Further, upon the formation of the silicon nanowires in the present invention, silicon nanowires may be doped with a dopant, thus obtaining doped silicon nanowires. In addition, silicon nanowires may be formed into a superlattice structure or a hybrid structure by changing the material or composition thereof. Exemplary embodiments of the silicon nanowires having a superlattice or hybrid structure may be formed of material selected from the group consisting of III-V group compounds (e.g., gallium arsenide (GaAs), gallium nitride (GaN)), carbon nanotube (CNT), zinc oxide (ZnO) and silicon carbide (SiC).

Alternative exemplary embodiments include configurations where the silicon nanowires are used without the glass template. The glass template may be removed using an etchant such as hydrofluoric acid.

Figure 4:
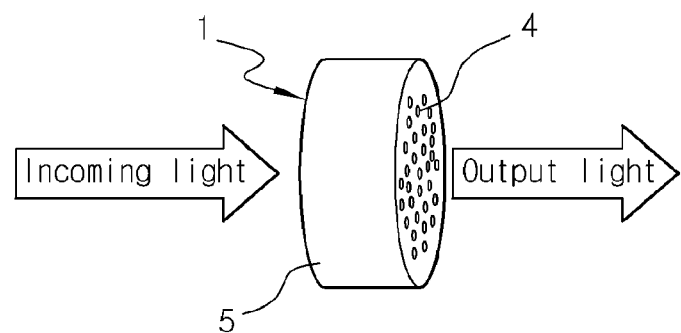
FIG. 4 is a perspective view showing an exemplary embodiment of a principle for improving the luminous efficiency of the silicon nanowires according to the present invention.

FIG. 4 is a perspective view showing an exemplary embodiment of a principle of improving the luminous efficiency of the silicon nanowires of the present invention. As shown in FIG. 4, the surface of the glass template 1, doped with erbium or an erbium precursor, may be subjected to a reflective coating 5, thereby increasing the luminous efficiency thereof. Incoming light passes through the template 1 with a reflective coating 5 and the silicon nanowires 4 to become output light.

Light produced by erbium ions may be scattered in the presence of glass. At this time, when a material having high reflectivity or a layer of distributed Bragg reflector ("DBR") is deposited on the wall surface or bottom surface of the template to increase the reflectivity thereof, light which contacts the surface-treated portion is not externally emitted, leading to total internal reflection. Accordingly, light may be emitted only to the portion having no reflective film, thus forming a predetermined orientation or increasing luminous efficiency.

An exemplary embodiment of the present invention provides a device comprising silicon nanowires where a material having high reflectivity or a layer of DBR is deposited on the wall surface or bottom surface of the template in which the nanowires are formed. Such an exemplary embodiment may be used in a wide array of devices, including but not limited to: electronic devices such as field effect transistors ("FETs"), sensors, photodetectors, light emitting diodes, laser diodes, electroluminescent ("EL") devices, photoluminescent ("PL") devices, and cathodoluminescent ("CL") devices.

Figure 5:
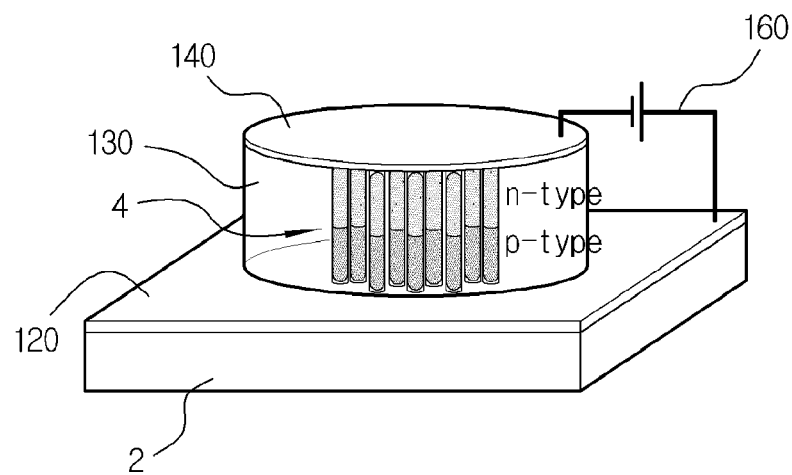
FIG. 5 is a perspective view showing an exemplary embodiment of an electroluminescent device according to the present invention.

The use of such a device as an EL device is further explained below, with reference to FIG. 5. FIG. 5 is a perspective view showing the EL device according to an exemplary embodiment of the present invention. As shown in FIG. 5, the device includes a substrate 2, a first electrode layer 120, nanowires 4 formed along pores in a porous template 130, a second electrode layer 140 and a battery 160. Although the formation of the first electrode layer 120 is shown on the substrate 2, it may alternatively be formed therebeneath.

The silicon nanowires 4 are p-type, n-type or p-n-type doped to have diode properties. In addition, the substrate 2, the first electrode layer 120, and the second electrode layer 140 may be manufactured through a known process using known material used for EL devices.

Generally, in EL devices using nanowires obtained through a prior art process, it is difficult to ensure linearity of the grown nanowires, spaces between the nanowires are filled with another material, and then the electrode is formed, leading to a complicated manufacturing process. However, when using the silicon nanowires formed through an exemplary embodiment of the method of the present invention, a glass template, which is transparent in the visible light range, is included, and therefore linearity is improved. The improvement in linearity leads to an increase in the coupling efficiency with an external photonic device. Additionally, the electrode may be easily formed as soon as the nanowires are formed. Hence, the luminescent device may be inexpensively manufactured using a simple process.

Further, an additional embodiment of the device including the silicon nanowires of the present invention can control the shape of silicon nanowire, and may be applied not only to PL devices, as in the prior art, but also to EL devices.

A better understanding of the present invention may be obtained in light of the following examples. However, these examples are set forth for the purpose of illustration and are not to be construed as limiting the scope of the present invention.

EXAMPLE 1

Manufacture of Silicon Nanowires (1)

Using a sputtering process, erbium (Er) was doped on a porous glass template having a diameter of about 100 μm and a length of about 1 μm, in which wire-shaped pores were formed to a diameter of about 20 nm and at intervals of about 40 nm.

The silicon substrate was treated with an organic cleaner and hydrofluoric acid to remove a naturally occurring oxide film, after which Au nanoparticles having a size of about 10 nm, commercially available from Nippon Paint Co. Ltd., were applied as a catalyst through spin coating.

Subsequently, in order to grow the silicon nanowires, the glass template doped with erbium was disposed on the substrate, after which the substrate was loaded into the furnace and then heated at a rate of 10~15° C. per minute while supplying argon (Ar) of 100 sccm at a pressure of 500 torr.

When the process temperature reached 1000° C., it was maintained for 30 minutes to grow the silicon nanowires. Thereafter, the temperature was slowly decreased to 700° C., and thus, the growth of the silicon nanowires was terminated.

EXAMPLE 2

Manufacture of Nanowires (2)

Silicon nanowires were manufactured in the same manner as in Example 1, with the exception that erbium chloride ($ErCl_3$) was used as the dopant instead of erbium, and 4% $SiH_4$ gas of 100 sccm was further supplied as the wire source in addition to the Ar gas, and the process temperature was controlled to 400° C.

EXAMPLE 3

Manufacture of EL Device

The silicon nanowires manufactured in Example 1 were disposed on the glass substrate patterned with indium tin oxide (ITO), after which an electrode was formed using a photo process.

Subsequently, titanium (Ti) was deposited to a thickness of 20 nm on the silicon wire-disposed substrate on which the electrode was formed, and then gold (Au) was deposited to a thickness of 100 nm to form a cathode, thereby completing the EL device.

As described hereinbefore, the present invention provides a method of manufacturing silicon nanowires using a porous glass template and a device comprising the silicon nanowires formed using the method. According to the present invention, the shape of the silicon nanowires, e.g., the diameter and length thereof, may be freely controlled by a simple and economical process, and silicon nanowires suitable for use in realizing a device and increasing the structural efficiency thereof may be manufactured. Thus, the silicon nanowires of the present invention may be effectively applied to various devices, such as electronic devices including FETs, sensors, photodetectors, light emitting diodes ("LEDs"), laser diodes, etc.

Although the present invention has been disclosed herein with reference to the foregoing exemplary embodiments, these exemplary embodiments do not serve to limit the scope of the present invention. Accordingly, those skilled in the art to which the present invention pertains will appreciate that various modifications, additions and substitutions are possible, without departing from the scope and technical spirit of the invention as disclosed in the accompanying claims.

What is claimed is:

1. A method of manufacturing silicon nanowires, comprising:
   doping a porous glass template having a plurality of wire-shaped pores with erbium or an erbium precursor;
   disposing the porous glass template doped with the erbium or erbium precursor on a metal catalyst layer formed on a substrate; and
   forming and growing silicon nanowires along the pores in the porous glass template.

2. The method as set forth in claim 1, wherein the porous glass template has a diameter ranging from about 1 nm to about 1 mm and a height ranging from about 100 nm to about 1 mm.

3. The method as set forth in claim 1, wherein the pores of the porous glass template have a diameter ranging from about 1 nm to about 100 nm, and are formed at intervals ranging from about 2 nm to about 1 μm.

4. The method as set forth in claim 1, wherein the doping of the porous glass template having a plurality of wire-shaped pores with the erbium or erbium precursor is conducted using a process selected from the group consisting of ion implantation, electrochemical deposition, spin-on doping, chemical deposition, sputtering, laser ablation, coprecipitation, a wet process, and a sol-gel process.

5. The method as set forth in claim 1, wherein the erbium precursor is erbium chloride (ErCl3).

6. The method as set forth in claim 1, further comprising subjecting a surface of the porous glass template to reflective coating, after the doping the porous glass template with erbium or the erbium precursor.

7. The method as set forth in claim 1, wherein the substrate is a silicon substrate or a glass substrate coated with silicon.

8. The method as set forth in claim 1, wherein the metal catalyst is selected from the group consisting of Au, Ni, Fe, Ag, Pd, and Pd/Ni.

9. The method as set forth in claim 1, wherein the metal catalyst layer is applied in a form of nanoparticles or a thin film.

10. The method as set forth in claim 1, wherein the metal catalyst layer is applied to a thickness of about 50 nm or less.

11. The method as set forth in claim 1, wherein the metal catalyst layer is applied using a process selected from the group consisting of chemical vapor deposition, sputtering, e-beam evaporation, vacuum deposition, spin coating, and dipping.

12. The method as set forth in claim 1, wherein the forming and growing silicon nanowires along the pores in the glass template is conducted using a solid-liquid-solid process (SLS) or a vapor-liquid-solid (VLS) process.

13. The method as set forth in claim 12, wherein the solid-liquid-solid process is conducted by placing the substrate on which the glass template is disposed in a furnace and then heating the substrate while supplying a gas such that nanowires are formed by a wire source diffused from the substrate.

14. The method as set forth in claim 12, wherein the vapor-liquid-solid process is conducted by placing the substrate on which the porous glass template is disposed in a furnace and then heating the substrate while supplying a gas and a wire source to form nanowires.

15. The method as set forth in claim 13, wherein the gas is selected from the group consisting of Ar, $N_2$, He, and $H_2$.

16. The method as set forth in claim 13, wherein the solid-liquid-solid process is conducted at a temperature of about 800° C. to about 1200° C. under about 760 torr or less.

17. The method as set forth in claim 14, wherein the wire source is selected from the group consisting of $SiH_4$, $SiCl_4$, and $SiH_2Cl_2$.

18. The method as set forth in claim 1, wherein the forming and growing silicon nanowires along the pores in the porous glass template is conducted to form doped silicon nanowires through a doping process using a dopant.

19. The method as set forth in claim 1, wherein the forming and growing silicon nanowires along the pores in the porous glass template is conducted to form nanowires in a form of a superlattice structure or a hybrid structure through changing a material or composition of the nanowires.

20. The method as set forth in claim 1, further comprising removing the glass template, after the forming and growing the silicon nanowires along the pores in the porous glass template.

21. The method as set forth in claim 14, wherein the gas is selected from the group consisting of Ar, $N_2$, He, and $H_2$.

22. The method as set forth in claim 14, wherein the vapor-liquid-solid process is conducted at a temperature of about 370° C. to about 600° C. under about 760 torr or less.

* * * * *

UNITED STATES PATENT AND TRADEMARK OFFICE
CERTIFICATE OF CORRECTION

PATENT NO. : 7,638,345 B2 Page 1 of 1
APPLICATION NO. : 11/444115
DATED : December 29, 2009
INVENTOR(S) : Lee et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 471 days.

Signed and Sealed this

Ninth Day of November, 2010

David J. Kappos
*Director of the United States Patent and Trademark Office*